United States Patent [19]

Waurick

[11] 4,174,499
[45] Nov. 13, 1979

[54] METHOD AND APPARATUS FOR THE MEASUREMENT OF ALTERNATING-CURRENT POWER IN TRANSIENT AND SUBTRANSIENT PROCESSES

[76] Inventor: Bruno G. Waurick, 14, Sylvia Pass, Linksfield, Johannesburg, South Africa

[21] Appl. No.: 836,795

[22] Filed: Sep. 26, 1977

[30] Foreign Application Priority Data

Sep. 27, 1976 [DE] Fed. Rep. of Germany ....... 2643457
Oct. 15, 1976 [DE] Fed. Rep. of Germany ....... 2646630

[51] Int. Cl.$^2$ ...................... G01R 21/06; G01R 25/00
[52] U.S. Cl. .................................. 324/107; 324/83 A; 324/142
[58] Field of Search ............... 324/107, 142, 141, 102, 324/83 A

[56] References Cited

FOREIGN PATENT DOCUMENTS 1389506  4/1975  United Kingdom ..................... 324/107

Primary Examiner—Rudolph V. Rolinec
Assistant Examiner—Ernest F. Karlsen
Attorney, Agent, or Firm—Fleit & Jacobson

[57] ABSTRACT

Disclosed is an apparatus and method for determining effective power and apparent power by multiplying voltage and current samples and algebraically summing the sample products to obtain effective power and level shifting the product signals to the level of the lower peaks of the envelope curve of the product signals which are proportional to the return power and algebraically summing the sample products to obtain apparent power.

8 Claims, 4 Drawing Figures

METHOD AND APPARATUS FOR THE MEASUREMENT OF ALTERNATING-CURRENT POWER IN TRANSIENT AND SUBTRANSIENT PROCESSES

This invention relates to a method to measure and meter a.c. power, even under transient and subtransient conditions, whereby first input signals which are proportional to the instantaneous value of a voltage as well as second input signals which are proportional to the instantaneous value of a current, are derived and multiplied with each other, so that the resultant product signals have a positive and negative polarity and are proportional to the product of the instantaneous values of current and voltage resulting in forward power, i.e., the power flowing from the source to the user and return power, i.e., the power being returned to the source and where these product signals are summated by considering their positive and negative polarity, so that the active power (or true or real power) is the sum of the product signals furthermore a measuring device for the measurement of a.c. power with a multiplying device to which first instantaneous values of the current which are proportional to the input pulses are connected generating product signals with positive and negative polarity and with two summating devices to which the product signals are delivered from the multiplying device whereby the product signals which are derived from the first summating device are added by noting their polarity in order to obtain the active power. Such a method and such a measuring device are known (DT-PS No. 23 43 842 or CH-PS No. 567 267).

It is furthermore known from "ETZ-B" Volume 20, 1968 Issue No. 20, pages 550–559 particularly page 557, that, for the purpose of measuring a.c. power proportional input signals are derived from the instantaneous values of the voltage as well as from proportional instantaneous values of the current, forming proportional input values and which signals are then multiplied together. Thereby, a suitable solution is seen for measuring and processing such signals in logarithmic function generators which operate according to the time division multiplication (TDM) principle.

With this known measuring method, an analog display, for instance on the screen of an oscilloscope, is only possible within certain limits, because it is said that at true four quadrant multiplication is not possible and can only be achieved by a time dissolution (chopping).

The conventional method of measuring a.c. power is relatively simple and reliable so long as the power factor does not deviate appreciably from unity. However, when the power factor is low, the measurement of power becomes difficult and erroneous results are obtained. This is particularly the case under transient and sub-transient conditions.

The reason could well be that when a.c. power is measured, even with the aid of the already mentioned time division multiplication method, one has not been able to discard the classical approach. Rather, when measuring such periodic changes and, of course, limited by the measuring means which were available, one had to apply imaginary dimensions such as active and reactive current as well as reactive power. With the commonly known electrodynamical measuring devices it was only possible to directly measure pulsating quantities but not oscillating ones.

According to the known measuring device described in DT-PS No. 23 43 842 resp. CH-PS No. 567 267, it is possible to obtain an exact determination of the active power, i.e. the difference between the forward power and the returned power, however, it is not possible to obtain the apparent power or voltamperes particularly when the cos $\phi$ ($\phi$=phase difference between current and voltage) tends to zero. This is due to the fact that, with the known measuring device, the actual pulsating behaviour of the apparent power cannot be readily displayed. Furthermore, it requires a relatively great effort in the way of artificial circuitry to process the product signals which are supplied to this summation device, when the polarity of such product signals had not been duly considered.

It is therefore the purpose of this invention to show a measuring method and the equipment with which it is possible to exactly determine not only the active power, but the apparent power as well, i.e. with its actually pulsating shape and as the sum of the absolute values of forward and return power.

This problem of determining the apparent power is solved by lowering the proportional product signals, derived from forward and return power, in relation to the reference line which is obtained from this power measurement to the lower peak of the envelope curve of the proportional product signal of the return power, whereby the same is added.

According to the invention the lowering of the reference line to the lower peak of the envelope curve, which is the proportional signal of the return power, is achieved by sensing its d.c. components which are added to the active power product signals.

Out of the signals, which have been determined for active power and apparent power, it is furthermore possible to obtain the power factor by dividing the so determined active power signal by the apparent power signal.

The measuring device, in accordance with the invention, is based on the formerly mentioned measuring device, thereby characterised that between the multiplying device and the second summation device the output of which is the apparent power, a device is connected which forms d.c. components out of the product signals delivered from the multiplying device and further summating devices (7a, 7b, 7c) which add the d.c. components to the product signals. The d.c. components can be proportional to the peak values of the return power.

To obtain the power factor, a divider can be connected to the outputs of the two summation devices.

Thereby this invention enables to measure all important a.c. power parameters singly or combined, viz.: active power, apparent power and the power factor.

The invention is based on the following reasoning:

When voltage and current have the same polarity, a positive product signal is obtained which is proportional to the so-called forward power. This forward power, which flows from the source to the consumer, contains the so-called return power which appears when, between current and voltage there is a phase shift and voltage and current have different polarities. This so-called return power is returned to the energy source to which the circuit is connected. Such product signals, which have been obtained from the voltage and current and which are proportional to the return power, have a negative polarity.

There is a constant phase shift of 90° between forward and return power. Therefore, the peak values of the forward power can be expressed as $$\hat{P}_F = \hat{U} \cdot \hat{I} \cdot \cos^2\phi/2$$

and the peak values of the return power as $$\hat{P}_R = \hat{U} \cdot \hat{I} \cdot \sin^2\phi/2$$

Because, as mentioned previously, the return power represents that portion of the power which is not consumed, and then represents active power Active power = Forward power − Return power = $\hat{P}_F - \hat{P}_R$ Apparent power is composed of forward power and return power. To enable the measurement of the instantaneous values of the apparent power, it is necessary to move the reference line, respectively the reference axis from which the individual values of the forward power and the return power have been obtained, into such a position that they appear to have the same polarity. In this invention this is achieved by lowering the reference line i.e. an artificial reference line is formed, which passes through the lower peak values of the return power.

Thereby, a pulsating signal is obtained which consists of the instantaneous values of the apparent power.

Apparent power can then be expressed as

Apparent power = Forward power + Return power = $\hat{P}_F + \hat{P}_R$

The power factor can then be defined as the quotient out of active power and apparent power, i.e.

$$\text{Power factor} = \frac{\hat{P}_F - \hat{P}_R}{\hat{P}_F + \hat{P}_R} = \frac{U \cdot I \cdot (\cos^2\frac{\phi}{2} - \sin^2\frac{\phi}{2})}{\hat{U} \cdot \hat{I} \cdot (\cos^2\frac{\phi}{2} - \sin^2\frac{\phi}{2})} \cos\phi$$

By applying a modern electronic or semi conductor technique, it is readily possible to constantly multiply voltage and current in order to obtain their instantaneous values, and based on the above mentioned approach, the power curve can be displayed as an envelope curve for a great number of instantaneous product signals obtained from the instantaneous values of voltage and current. Such can be displayed as mean values on analogue and digital instruments.

From the above mentioned approach it furthermore follows, that it is possible to determine the power factor within a single power wave so that, even under subtransient conditions, the power factor can be determined by means of this invention. Naturally, this is also the case for the apparent power and the active power under such conditions.

The following possibilities and advantages result out of this invention:

(1) When a dead circuit is excited, the first signal must be forward because otherwise, no return signal can occur.

(2) Active power is all or part of the forward power during the condition when voltage and current have the same polarity.

(3) A unity power factor condition exists when all forward power is converted into work.

(4) At zero power factor, foward and return power are equal. Obviously, the latter can never be greater than the former.

(5) Only the return power signal oscillates in relation to the relative axis.

(6) There is a phase shift of 90° between forward and return power. Since instantaneous values are processed, there is no time dimension in this measuring approach and no discrimination made between inductive or capacitive conditions.

(7) The generated signals process the harmonics of voltage and current.

(8) No symmetry errors occur because only voltages and currents of the same phase are multiplied with each other.

(9) It is readily possible to sum single phase signals to three phase signals. Thereby the three phase power factor can be determined. However, the power factor is not expressed as a phase angle but as a quotient.

(10) The envelope curve which embraces the momentary values of the power signals may have any shape. It is for instance feasable, that under transient conditions the phase angle changes momentarily. Under such conditions, it is advantageous to determine the power factor not as an angle but rather as a quotient.

As illustrated by the attached figures, which also include an example of the invention, the invention is explained in detail.

Figure 1:
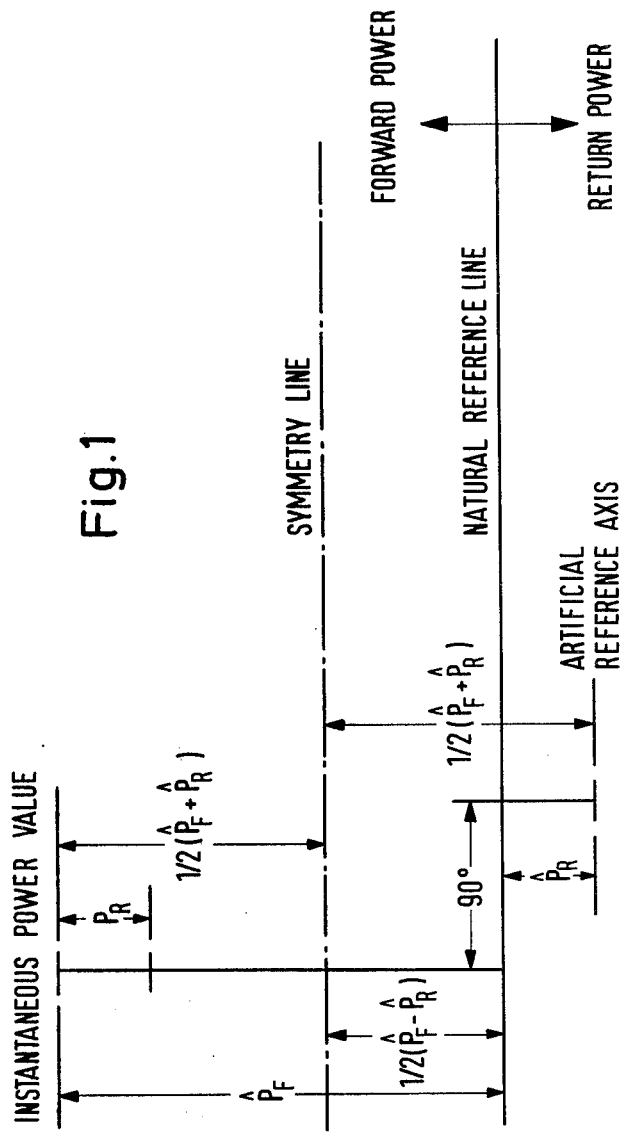
FIG. 1 shows an illustration of the instantaneous peak values of power.

Since voltage and current oscillate in relation to a reference axis, which is called natural reference line in the FIG. 1, the same applies to the power. However, power oscillates in relation to the symmetry axis, which is called the symmetry line, whereby the instantaneous power values are of the magnitude $\frac{1}{2}(\hat{P}_F + \hat{P}_R)$.

The instantaneous values of the active power, which oscillates in relation to the symmetry line, are of the magnitude $\frac{1}{2}(\hat{P}_F - \hat{P}_R)$, where $\hat{P}_F$ denotes the forward power and $\hat{P}_R$ the return power.

Figure 2:
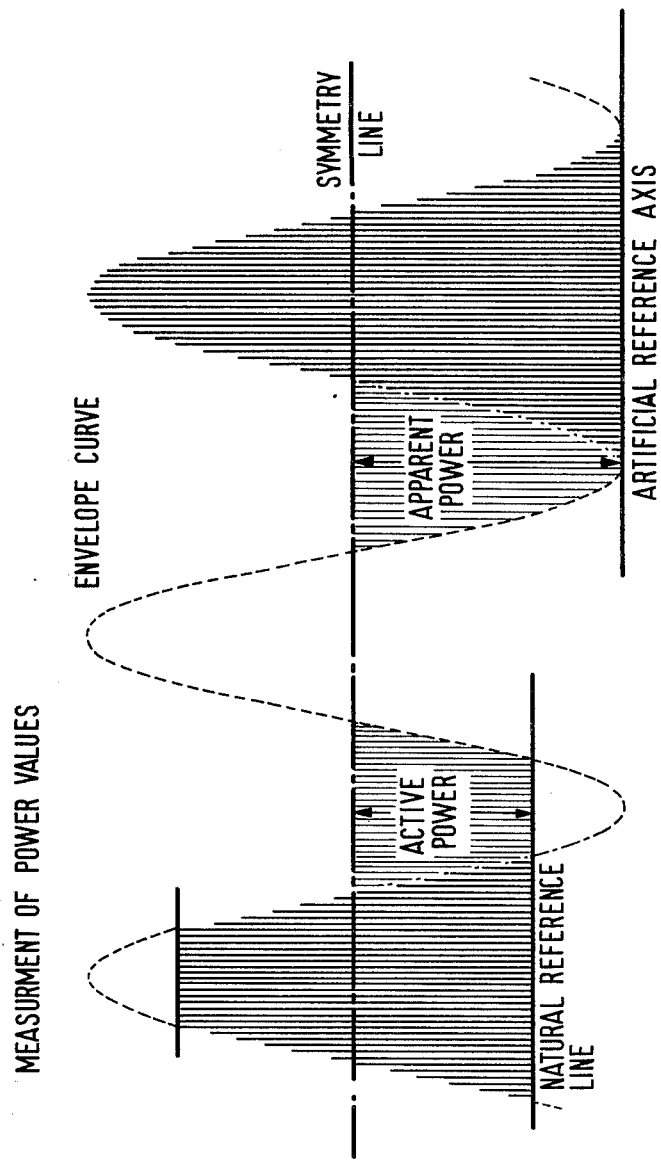
FIG. 2 shows the envelope curve of the values of the power measurement.

FIG. 2 shows that the power curve can be expressed as an envelope curve consisting of a very great number of instantaneous values. In connection with FIG. 1 it can be shown that the instantaneous values of the forward power appear above the natural line and the instantaneous values for the return power are lying below the natural reference line. To represent the instantaneous values of the apparent power this invention now makes use of the fact that power measurements are no longer represented in relation to the natural reference line, but rather from an artificial reference line which is called "artificial reference axis" in FIGS. 1 and 2. This artificial reference axis passes through the lower peaks of the envelope curve. Such shifting of the reference line or the reference axis, is in this invention achieved by forming a d.c. component out of the instantaneous power signals which is added to these signals. In this way, one obtains signals or impulses for the instantaneous values of the apparent power, the envelope curve of which has an impulse shape which rests on the artificial reference axis. In this connection, reference is made to the right hand impulse illustration in FIG. 2.

Figure 3:
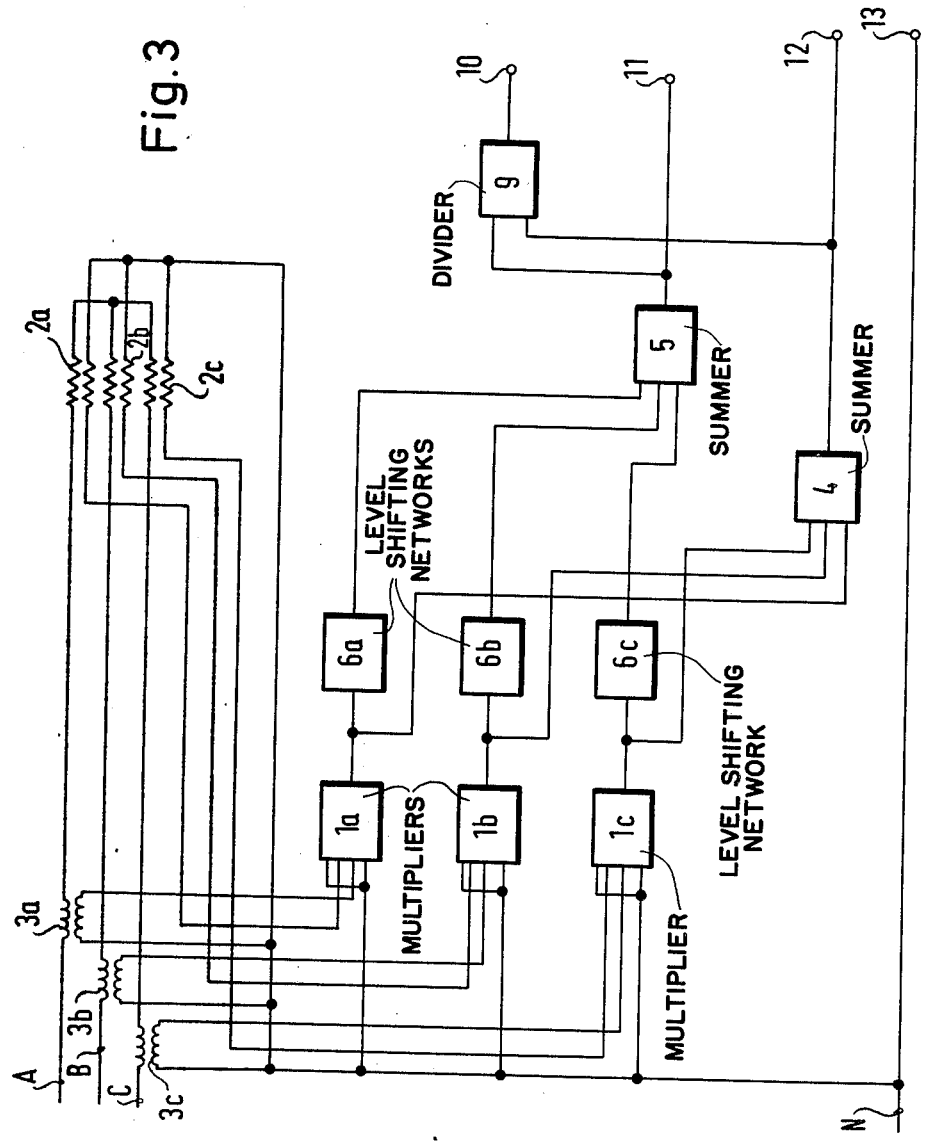
FIG. 3 shows a block diagram of one example of the invention.

A block connection diagram of a measuring device with which a shifting of the natural reference axis into the artificial reference axis can be carried out, is shown in FIG. 3. This contains three rapid acting multipliers 1a, 1b and 1c, which may be four quadrant multiplying devices. Each of these multiplying devices is connected via its own potential transformers 2a, 2b and 2c in parallel to the corresponding phase conductors A, B, C and the neutral conductor of a three phase supply system. Thereby first input signals are put onto each multiplying device which are proportional to the instantaneous values of the voltage of the supply system during each cycle. Each multiplying device 1a, 1b and 1c is furthermore connected via its own current transformers 3a, 3b, 3c to the corresponding phase conductors A, B, C of the supply system. Thereby second input signals can be fed to each multiplying device which are proportional to the instantaneous values of the current in the supply system during each cycle.

The multiplying devices 1a, 1b and 1c take cognizance of the polarities of the first and second input signals and generate product signals with positive and negative polarity, whereby the product signals with positive polarity are proportional to the instantaneous values of the forward power $\hat{P}_F$ and the product signals with negative polarity are proportional to the instantaneous values of the return power $\hat{P}_R$.

The outputs of the multiplying devices 1a, 1b and 1c are directly connected to one of the first common summating devices 4. This summating device receives the product signals and takes cognizance of their polarity. The output signals of the summating device 4 are proportional to the instantaneous values of the forward power $\hat{P}_F$ resp. the return power $\hat{P}_R$.

The outputs of the multiplying devices 1a, 1b, 1c are connected to a second summating device 5 via means 6a, 6b, 6c which remove the d.c. components from the power signals achieved by means of the multiplying devices 1a, 1b, 1c. This results in the shifting of the natural reference axis in relation to the artificial axis so that the summating device 5 determines the apparent power with reference to this artificial axis. The individual signals are added in the summating device 5 thereby producing the instantaneous values of the apparent power signals of the magnitude $(\hat{P}_F + \hat{P}_R)$.

Figure 4:
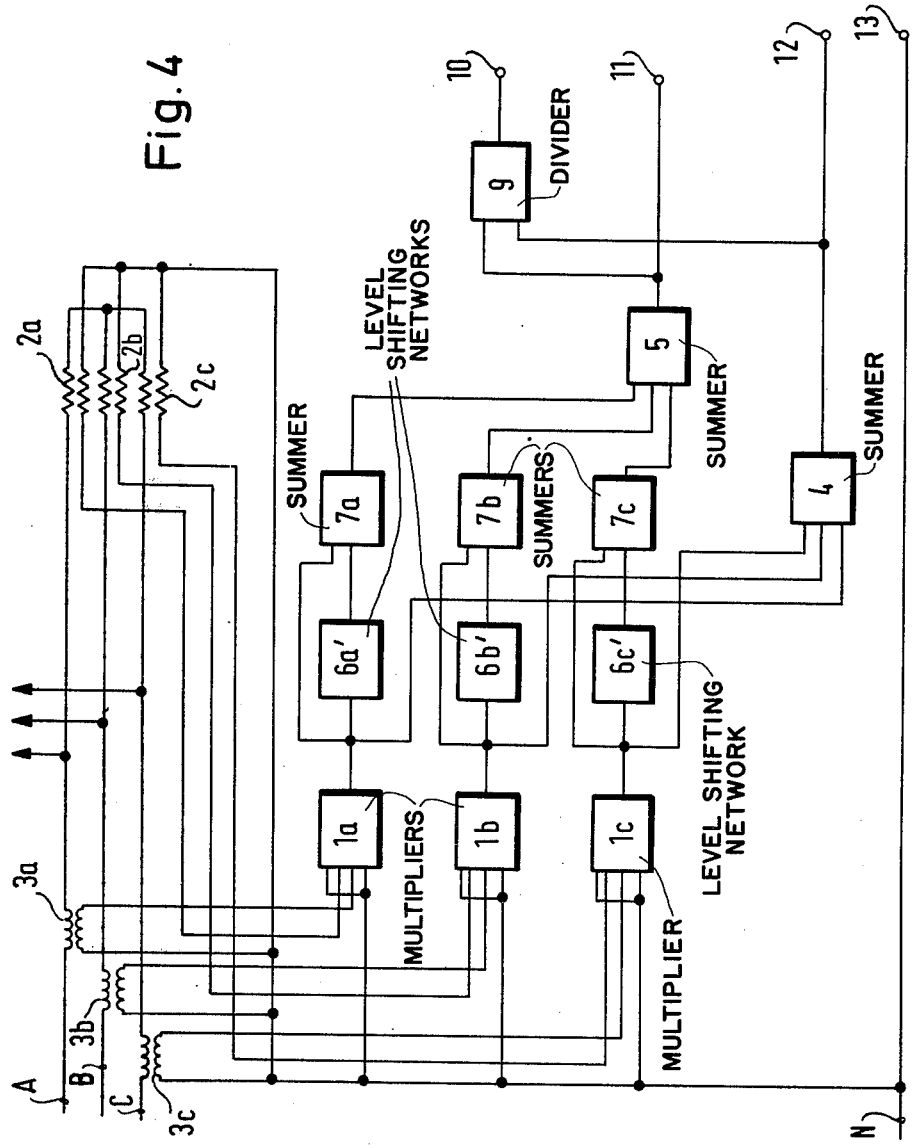
FIG. 4 shows a block diagram of another example of the invention.

According to FIG. 4 the outputs of the multiplying devices 1a, 1b, 1c are connected to the means 6a', 6b' and 6c' which produce d.c. signals out of the multiplying devices 1a, 1b, 1c which are equal to the peak values $\hat{P}_R$ of the return power. Furthermore, the outputs of the multiplying devices 1a, 1b, 1c are connected to summating devices 7a, 7b, 7c to which the means 6a', 6b', 6c' are also connected. The d.c. components which are produced in the means 6a', 6b', 6c' are added in the summating devices 7a, 7b, 7c to the output signals of the multiplying devices 1a, 1b, 1c. This results in the shifting of the natural reference axis in relation to the artificial axis so that the summating device 5 determines the apparent power with reference to this artificial axis. This individual signals are added in the summating device 5 thereby producing the instantaneous values of the apparent power signals of the magnitude $(\hat{P}_F + \hat{P}_R)$.

The outputs of both summating devices 4 and 5 are connected to a divider 9. By dividing the signals $(\hat{P}_F - \hat{P}_R)$ and $(\hat{P}_F + \hat{P}_R)$, i.e. active power by apparent power, in the divider 9 a quotient is obtained which, as shown previously, represents the power factor.

Signals which are proportional to the power factor appear on terminals 10,13 whilst signals proportional to the apparent power appear on terminals 11,13 and signals proportional to active power appear on terminals 12,13. Naturally, one, two or all signals can be sensed. The output signals from the measuring device are available practically without any measuring time delay. Therefore, the measuring device is also suitable to investigate transient and subtransient power changes, especially such occuring during switching operations. The shown measuring device produces all important parameters of a.c. power. The input steps of the shown measuring device are suitable for electronic circuits having extremely high or extremely low impedances. Therefore, the power withdrawn from the energy source to operate the measuring device is negligibly low. Instrument transformers with low outputs can therefore be used. As already mentioned, changes in phase angle or harmonic wave distortions etc. can be measured or are taken cognizance of in this invention.

This invention makes it possible to measure the electrical power irrespectively whether produced as the product of d.c. or a.c. voltage and current, whereby the magnitudes of voltage and current are utilised as unidimensional linear values which are positioned verticaly to the reference axis or reference line. Consequently, it is possible to do without parameters like active and reactive current or reactive power etc., which had to be used with the measuring equipment which was available in former times.

To indicate the power factor, a commonly known cross coil instrument may be used which gives a somewhat linear indication between the ranges 0.6–1.0. Whilst the commonly known method uses an electro dynamic power factor meter which indicates the power factor corresponding to a cos $\phi$ scale.

Furthermore, the following table shows the calculated values of instantaneous power derived from a sinusoidal voltage of 100 V (peak) and a sinusoidal current of 15 A (peak) at 50 Hz for steps in phase shift from 0°–90°.

| Peak Values of Instanteaneous Power Calculated from a Sinusoidal Voltage and a Sinusoidal Current $\hat{V}$ = 100 V (Peak), $\hat{I}$ - 15 A (Peak) at 50 Hz with the phase angle varying from 0° to 90°. | | | | | | | | |
|---|---|---|---|---|---|---|---|---|
| 1 | 2 | 3 | 4 | 5 | 6 | 7 | 8 | 9 |
| Phase Angle (lagging) | Positive Forward Power | Negative Return Power | Oscillating Power =Overshoot + Return | Active Power | Apparent Power | Power Factor | Reactive Power | R.M.S. Active Power = Average |
| Formula | $\hat{P}_F = \hat{V}\hat{I}\cos^2\frac{\phi}{2}$ | $\hat{P}_R = \hat{V}\hat{I}\sin^2\frac{\phi}{2}$ | $2\hat{P}_R$ | $\hat{W}=\hat{P}_F-\hat{P}_R$ or $\hat{V}\hat{I}\cos\phi$ | $\hat{V}A=\hat{P}_F+\hat{P}_R$ = $\hat{V}\hat{I}$ | $\cos\phi = \frac{\hat{P}_F - \hat{P}_R}{\hat{P}_F + \hat{P}_R}$ | $V\hat{A}R=2\sqrt{\hat{P}_F\hat{P}_R}$ = $\hat{V}\hat{I}\sin\phi$ | $W = \frac{1}{2}(\hat{P}_F+\hat{P}_R)$ = $\frac{\hat{V}\hat{I}}{2}\cos\phi$ |
| 0 | 1500 W | 0 W | 0 W | 1500 W | 1500 W | 1.0000 | 0 VAR | 750 W |

-continued

Peak Values of Instanteneous Power Calculated from a Sinusoidal Voltage and a Sinusoidal Current $\hat{V} = 100$ V (Peak), $\hat{I} - 15$ A (Peak) at 50 Hz with the phase angle varying from 0° to 90°.

| 1 | 2 | 3 | 4 | 5 | 6 | 7 | 8 | 9 |
|---|---|---|---|---|---|---|---|---|
| Phase Angle (lagging) | Positive Forward Power | Negative Return Power | Oscillating Power = Overshoot + Return | Active Power | Apparent Power | Power Factor | Reactive Power | R.M.S. Active Power = Average |
| Formula | $\hat{P}_F = \hat{V}\hat{I}\cos^2\frac{\phi}{2}$ | $\hat{P}_R = \hat{V}\hat{I}\sin^2\frac{\phi}{2}$ | $2\hat{P}_R$ | $\hat{W} = \hat{P}_F - \hat{P}_R$ or $\hat{V}\hat{I}\cos\phi$ | $\hat{VA} = \hat{P}_F + \hat{P}_R = \hat{V}\hat{I}$ | $\cos\phi = \frac{\hat{P}_F - \hat{P}_R}{\hat{P}_F + \hat{P}_R}$ | $\hat{VAR} = 2\sqrt{\hat{P}_F\hat{P}_R} = \hat{V}\hat{I}\sin\phi$ | $W = \frac{1}{2}(\hat{P}_F + \hat{P}_R) = \frac{\hat{V}\hat{I}}{2}\cos\phi$ |
| 5 | 1497,1460 | 2,8539 | 5,7079 | 1494,2921 | " | 0.996195 | 130,7318 | 747,1460 |
| 10 | 1488,6058 | 11,3941 | 22,7883 | 1477,2116 | " | 0,984808 | 260,47129 | 738,6058 |
| 15 | 1474,4443 | 25,5556 | 51,1112 | 1448,8887 | " | 0,965926 | 388,2283 | 724,4443 |
| 20 | 1454,7694 | 45,2305 | 90,4610 | 1409,5389 | " | 0,939693 | 513,03 | 704,7694 |
| 25 | 1429,7308 | 70,2691 | 140,5383 | 1359,4617 | " | 0,906308 | 633,927 | 679,7308 |
| 30 | 1399,5190 | 100,4809 | 200,9618 | 1299,0381 | " | 0,866025 | 750,000 | 649,5190 |
| 35 | 1364,3640 | 135,6359 | 271,2719 | 1228,7281 | " | 0,819152 | 860,3644 | 614,3640 |
| 40 | 1324,5333 | 175,4666 | 350,9333 | 1149,0667 | " | 0,766044 | 964,1812 | 574,5333 |
| 45 | 1280,3300 | 219,6699 | 439,3398 | 1060,6601 | " | 0,707107 | 1060,66 | 530,3300 |
| 50 | 1232,0907 | 267,9092 | 535,8185 | 964,1815 | " | 0,642788 | 1149,0664 | 482,0907 |
| 55 | 1180,1823 | 319,8176 | 639,6353 | 860,3647 | " | 0,573576 | 1228,58 | 430,1823 |
| 60 | 1125,0000 | 375,0000 | 750,000 | 750,0000 | " | 0,50000 | 1299,038 | 375,0000 |
| 65 | 1066,9636 | 433,0363 | 866,0726 | 633,9273 | " | 0,422618 | 1359,4616 | 316.9636 |
| 70 | 1006,5151 | 493,4848 | 986,9697 | 513,0303 | " | 0,342020 | 1409,5387 | 256,5151 |
| 75 | 944,1142 | 555,8857 | 1111,7714 | 388,2285 | " | 0,258819 | 1448,8885 | 194,1142 |
| 80 | 880,2361 | 619,7638 | 1239,5277 | 260,4723 | " | 0,173648 | 1477,2115 | 130,2361 |
| 85 | 815,3668 | 684,6331 | 1369,2663 | 130,7337 | " | 0,087156 | 1494,292 | 65,3668 |
| 90 | 750 | 750 | 1500 | 0 | 1500 | 0 | 1500 | 0 |

I claim:

1. A method for measurement of a.c. power relative to a source and a load, in particular for transient and subtransient events, comprising the steps of: deriving first input signals which are proportional to instantaneous values of a voltage, deriving second input signals which are proportional to instantaneous values of a current, multiplying said first and second input signals with each other, obtaining product signals of positive and negative polarity which are proportional to the product of the current and voltage instantaneous values and thus to the forward power flowing from said source to said load and return power flowing back to said source, summing said product signals by adding the product signals taking into consideration the positive and negative signs and determining the effective power, and level shifting the reference line on which the measurement is based to the level of the lower peaks of the envelope curve of the product signals which are proportional to the return power and determining the apparent power by adding the level shifted product signals which are proportional to the forward power and return power.

2. A method according to claim 1, characterised in that in the step of determining the apparent power the d.c. components are removed from the product signals used to determine the effective power and the resulting signals are added.

3. A method according to claim 1, characterised in that in the step of lowering the reference line, on which the measurement is based, to the lower peak positions of the envelope curve of the product signals proportional to the return power in the determination of the apparent power by adding the product signals proportional to the forward power ($\hat{P}_F$) and the return power ($\hat{P}_R$), d.c. components are formed from the product signals used for determining the effective power and are added to these product signals.

4. A method according to claim 1, comprising the further step of determining the power factor by dividing the signals obtained in the determination of the effective power by the signals obtained in the determination of the apparent power.

5. A measuring device for a.c. power measurement comprising multiplying means to which first input pulses proportional to instantaneous voltage values and second input pulses proportional to instantaneous current values are applied for producing product signals of positive and negative polarity, first and second summating devices to which the product signals produced by the multiplying means are fed, whereby to determine the effective power the product signals are added in the first summating device taking into account the polarity, wherein between the multiplying means (1a, 1b, 1c) and the second summating device (5), the output of which delivers the apparent power ($\hat{P}_F + \hat{P}_R$), level shifting means (6a, 6b, 6c) are connected which remove the d.c. components from the product signals supplied by the multiplying means.

6. A measuring device according to claim 5, characterised in that said level shifting means (6a', 6b', 6c') which produce d.c. components from the product signals supplied by the multiplying means and further summating devices (7a, 7b, 7c) which add the d.c. components to the product signals of the multiplying means are connected between the multiplying means (1a, 1b, 1c) and the second summating device (5), the output of which gives the apparent power ($\hat{P}_F + \hat{P}_R$).

7. A measuring device according to claim 5, further comprising a divider (9) connected to the outputs of the first and second summating devices (4 and 5), in which the effective power and the apparent power are determined.

8. A measuring device according to claim 5, characterised in that a crossed-coil instrument is provided for displaying the power factor.

* * * * *